United States Patent
Pausch et al.

[11] Patent Number: 5,512,828
[45] Date of Patent: Apr. 30, 1996

[54] ACTIVELY SHIELDED TRANSVERSE GRADIENT COIL FOR NUCLEAR MAGNETIC RESONANCE TOMOGRAPHY APPARATUS

[75] Inventors: Guenther Pausch, Effeltrich; Heinz Hentzelt, Erlangen, both of Germany

[73] Assignee: Siemens Aktiengesellschaft, Munich, Germany

[21] Appl. No.: 492,570

[22] Filed: Jun. 20, 1995

[30] Foreign Application Priority Data

Jun. 29, 1994 [DE] Germany ............... 44 22 782.5

[51] Int. Cl.⁶ .................................... G01R 33/20
[52] U.S. Cl. ................ 324/309; 324/318; 128/653.2
[58] Field of Search ................ 324/300, 307, 324/309, 310, 311, 312, 313, 314, 318, 322; 128/653.2, 653.3, 653.4

[56] References Cited

U.S. PATENT DOCUMENTS

| | | | |
|---|---|---|---|
| 3,309,107 | 5/1994 | Pausch | 324/318 |
| 5,296,810 | 3/1994 | Morich | 324/319 |
| 5,343,148 | 8/1994 | Westphal et al. | 324/309 |
| 5,349,296 | 9/1994 | Cikotte et al. | 324/309 |
| 5,414,360 | 5/1995 | Westphal et al. | 324/318 |
| 5,416,414 | 5/1995 | Mansfield et al. | 324/318 |
| 5,457,387 | 10/1995 | Patrick et al. | 324/318 |

FOREIGN PATENT DOCUMENTS 0216590  4/1987  European Pat. Off. .
2265986 10/1993  United Kingdom .

*Primary Examiner*—Michael Tokar
*Attorney, Agent, or Firm*—Hill, Steadman & Simpson

[57] ABSTRACT

An actively shielded transverse gradient coil arrangement contains a primary coil and a secondary coil that are arranged at a radial spacing from one another. Turns of the primary coil and the secondary coil disposed farther from the center of the examination volume in an axial direction of the gradient coil arrangement have a smaller radial spacing from one another than do turns lying close to the center. The parasitic flux density can thus be minimized. This is particularly important in EPI sequences for avoiding physiological stimulations in the examination subject.

17 Claims, 17 Drawing Sheets

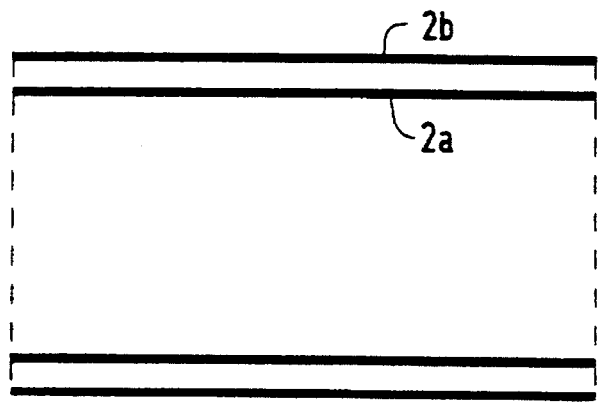
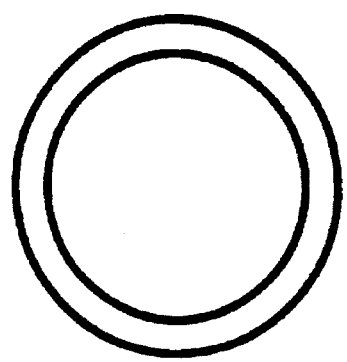
FIG 4
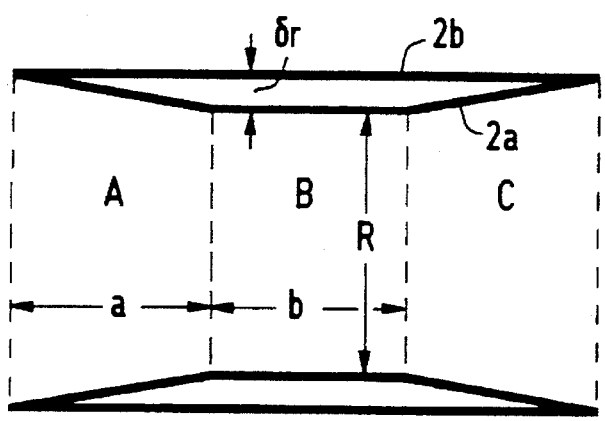
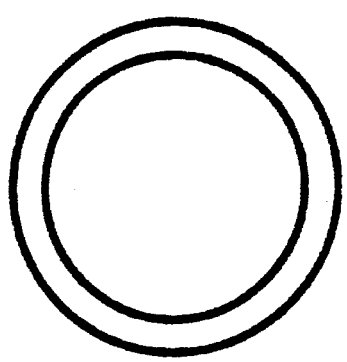
FIG 5
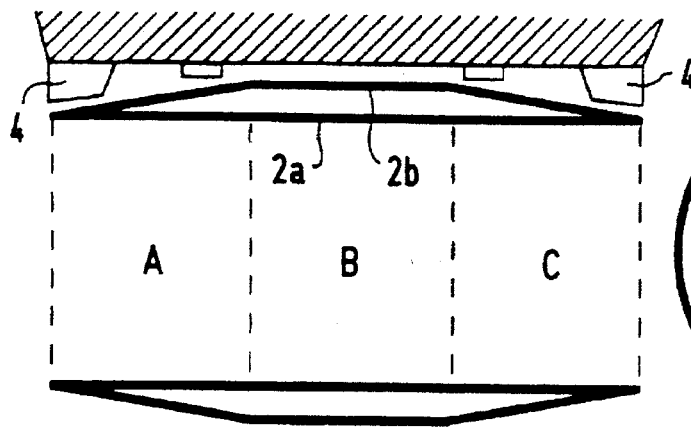
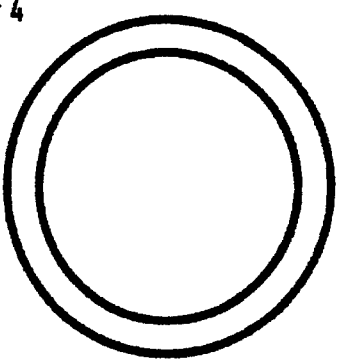
FIG 6

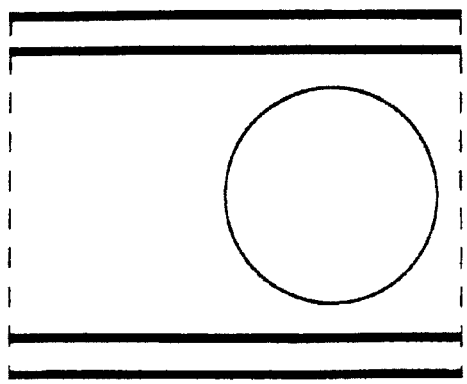 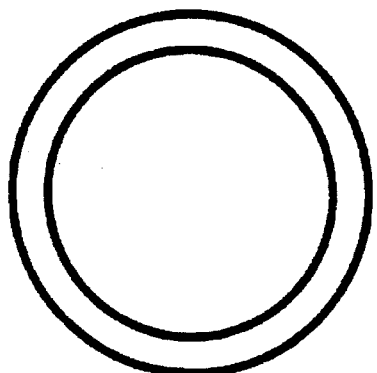
FIG 14
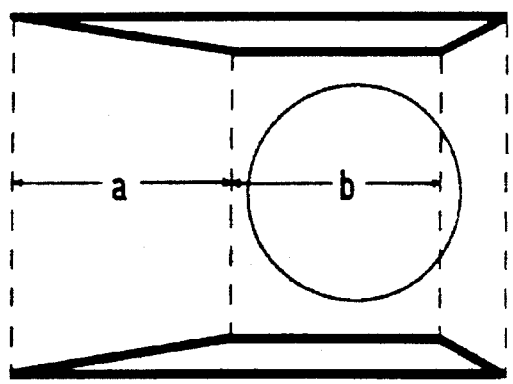 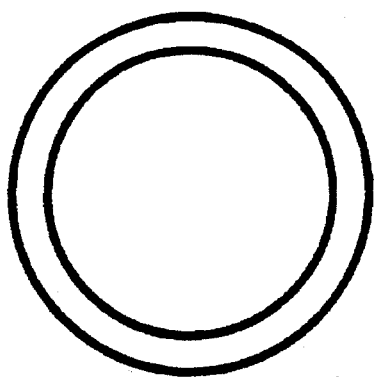
FIG 15
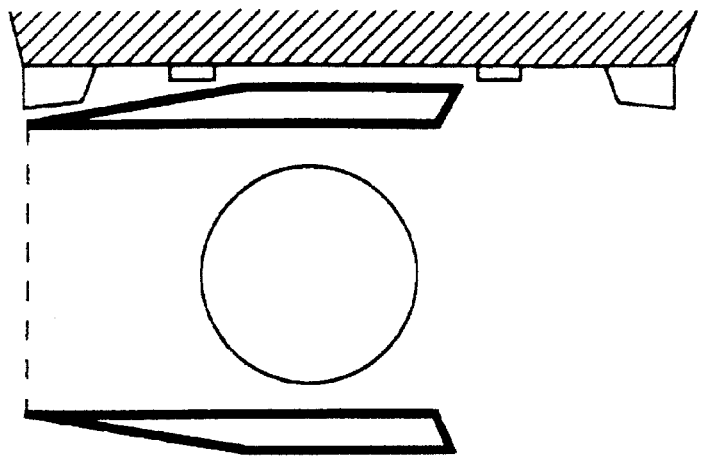 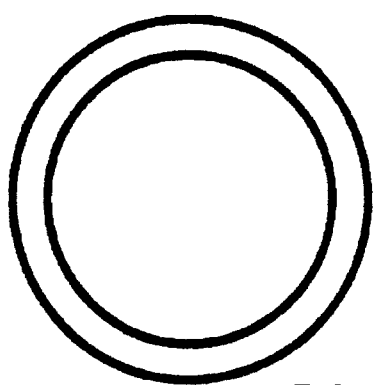
FIG 16

ACTIVELY SHIELDED TRANSVERSE GRADIENT COIL FOR NUCLEAR MAGNETIC RESONANCE TOMOGRAPHY APPARATUS

BACKGROUND OF THE INVENTION

1. Field of the Invention

The present invention is directed to an actively shielded, transverse gradient coil arrangement for a nuclear magnetic resonance tomography apparatus, of the type wherein each gradient coil being composed of two sub-coils and each sub-coil being composed of a primary and a secondary coil radially spaced from one another, the secondary coil lying on a larger radius than the primary coil, and the primary and secondary coil generating a linear magnetic field gradient in the center of an examination volume.

2. Description of the Prior Art

European Application 0 216 590, for example, discloses such an actively shielded gradient coil arrangement of the above general type.

As is known, a spatial resolution of the nuclear magnetic resonance signals ensues in nuclear magnetic resonance tomography by generating a uniform, static basic field on the order of magnitude of 1T with magnetic field gradients superimposed on it. The principles of such imaging are explained, for example, in the article by Bottomley, "NMR Imaging Techniques and Applications—A Review", in Review of Scientific Instrumentation 53, 9, 9/82, pp. 1319–1337. For spatial resolution in three dimensions, magnetic field gradients must be generated in three directions that are preferably perpendicular relative to one another. The conventional structure of gradient coils used to generate such gradient fields (not actively shielded in this case) shall be set forth below with reference to FIGS. 1 and 2. An examination volume 4 with a coordinate axes x, y, z representing the directions of the respective gradients is shown in each of FIGS. 1 and 2.

FIG. 1 schematically shows a conventional arrangement of transverse gradient coils for generating a magnetic field gradient $G_y$ in the y-direction. The gradient coils 2 are implemented as saddle coils that are secured on a carrying tube 1. A substantially constant magnetic field gradient $G_y$ is generated in the y-direction within the spherical examination volume 4 by the conductor sections 2a. The return conductors generate only slight magnetic field components in the examination volume 4 due to their size and distance from the examination volume 4; these magnetic field components are often left out of consideration when designing the gradient coil.

The gradient coils for the x magnetic field gradients are identical to the gradient coils 2 for the y magnetic field gradients and are merely turned by 90° in azimuthal direction on the carrying tube 1. For clarity they are therefore not shown in FIG. 1.

The conventional (axial) gradient coils 5 for the magnetic field gradients in the z-direction are schematically shown in FIG. 2. The coils are annularly implemented and arranged symmetrically relative to the center 3 of the examination volume 4. Since the two individual coils 3a and 3b respectively have current flowing in opposite directions therein as shown in FIG. 2, they cause a magnetic field gradient in the z-direction.

Given actively shielded gradient coils as shown, for example, in the aforementioned European Application 0 216 590, the gradient coils 2 of FIG. 1—which are referred to as primary coils-are surrounded by further, identical coils that are likewise arranged on a cylinder surface that, however, has a larger diameter than the coil carrier 1. These further coils are referred to as secondary coils and have current therein in the opposite direction when compared to the gradient coil arrangement 2. This achieves a gradient field that is substantially attenuated toward the outside, and thus the induction of eddy currents in surrounding, metallic parts is largely suppressed. An unavoidable attenuation of the gradient field thus also occurs in the examination volume 4 and must therefore be compensated by larger numbers of turns and/or higher currents.

In order to avoid image distortions, high demands are made on the linearity of gradient fields; these demands cannot be satisfied with the schematically illustrated, simple conductor structures of FIGS. 1 and 2. The transverse gradient coils are thereby complicated in terms of design. German OS 42 03 582, corresponding to U.S. Pat. No. 5,309,107, discloses a numerical method for calculating more complex coil geometries (conductor orientation) with which the gradient coils can be optimized in many ways by formulating boundary conditions.

Given specific pulse sequences, for example echo planar imaging (EPI), rapidly oscillating gradient fields having a high field strength are required. Uncontrollable physiological reflexes of the examination subject having more or less painful side effects can thereby locally occur due to interactions with nerves and muscles. Although the biophysical mechanisms of these so-called stimulations are extremely complex, the triggering factor thereof is always the chronological change of the magnetic flux $\Phi$ to which the person under examination is exposed. Since, for example, it is advantageous for EPI imaging to employ high gradient fields given frequencies of approximately 1KHz, one must generally expect high values for $d\Phi/dt$.

The relationship between useful gradient and flux density in the coil volume is comparatively unfavorable in transverse gradient coils. FIG. 3 shows the field lines of a coil arrangement for generating a y-gradient in the plane x =0. The concentration of the field lines that corresponds to a high magnetic flux density can clearly be seen outside the imaging volume. Whereas the major part of the field generated by the coil is conducted around the examination volume, the useful field itself seems very small in relation. Although this situation cannot be entirely avoided for physical reasons, one can nonetheless attempt to optimize the ratio of useful field to the gradient fields of the examination volume. When one succeeds in achieving this, the problems of the stimulation of physiological stimuli given rapidly switched gradients with high amplitude are also alleviated.

Such an optimization can be fundamentally approached with the method from the aforementioned German OS 42 03 582 and U.S. Pat. No. 5,309,107. For example, an objective is formulated with reference to the optimization procedures so that the maximum deviations of the rated field within the examination volume are prescribed and the radial field course in the outer space is simultaneously minimized. An improvement in the ratio of the useful field to other coil fields can in fact be fundamentally achieved with this method, but only within relative narrow limits. This arises from the fact that one does not have adequate degrees of freedom for an optimization due to the separate construction of the primary coil and the secondary coil on two cylindrical surfaces.

SUMMARY OF THE INVENTION

It is an object of the invention to fashion an actively shielded gradient coil arrangement such that the field density course outside the examination volume is minimized while largely retaining the field course in an unattenuated form in the examination volume.

The above object is achieved in accordance with the principles of the present invention in a transverse gradient coil arrangement for a nuclear magnetic resonance tomography apparatus wherein each gradient coil is composed of a primary coil and a secondary coil, the primary and secondary coils having a radial spacing from each other and the secondary coil lying on a larger radius than the primary coil, the primary coil and the secondary coil in combination generating a linear magnetic field in the center of an examination volume, and the windings or turns of the primary coil and the secondary coil which are disposed farther from the center of the examination region in an axial direction of the gradient coil arrangement having a smaller radial spacing from each other than windings of the primary and secondary coils which are disposed close to the center.

The cylinder structure of gradient coils that is typical in MR is thereby replaced by a flexible geometry that offers substantial improved possibilities for optimization in the aforementioned sense. A not insubstantial part of the disturbing flux density outside of the examination volume results from conductor returns in regions remote from the examination volume. These conductor returns barely constructively contribute to the useful field. The disturbing gradient field in these regions becomes substantially weaker due to the diminished spacing between the primary coil and the secondary coil in the region of the conductor returns and the opposite current directions in the primary and secondary coils.

DESCRIPTION OF THE DRAWINGS

FIG. 4 is a schematic illustration of an actively shielded transverse gradient coil arrangement for explaining the basic structure of the invention.

FIGS. 5–13 respectively illustrate different embodiments of the gradient coil of the invention, in side and end views.

FIG. 14 shows a gradient coil arrangement of the prior art that is asymmetrically constructed with reference to the center of the examination space.

FIGS. 15–18 respectively show embodiments of asymmetrical gradient coil arrangements corresponding to the invention.

DESCRIPTION OF THE PREFERRED EMBODIMENTS

Figure 1:
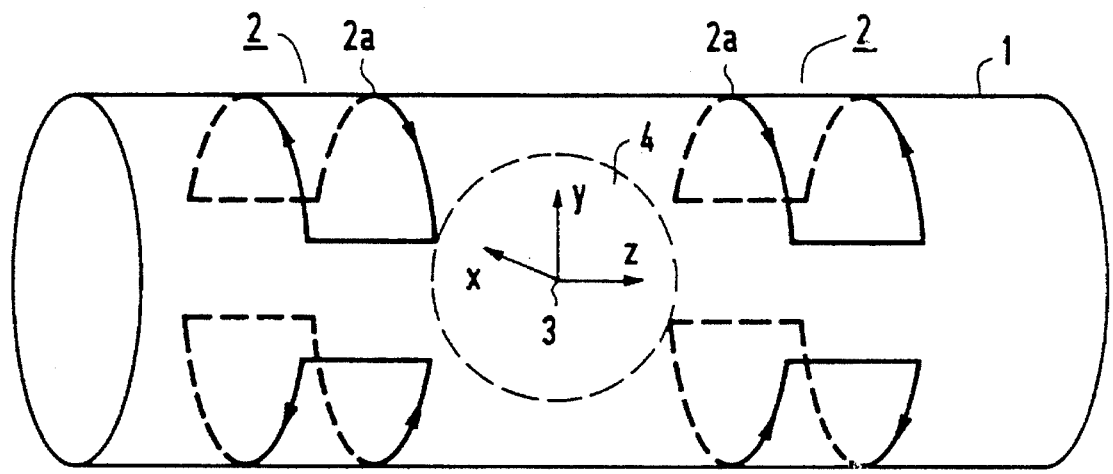
FIGS. 1 and 2 illustrate a known gradient coil arrangement for a magnetic resonance imaging apparatus.
Figure 2:
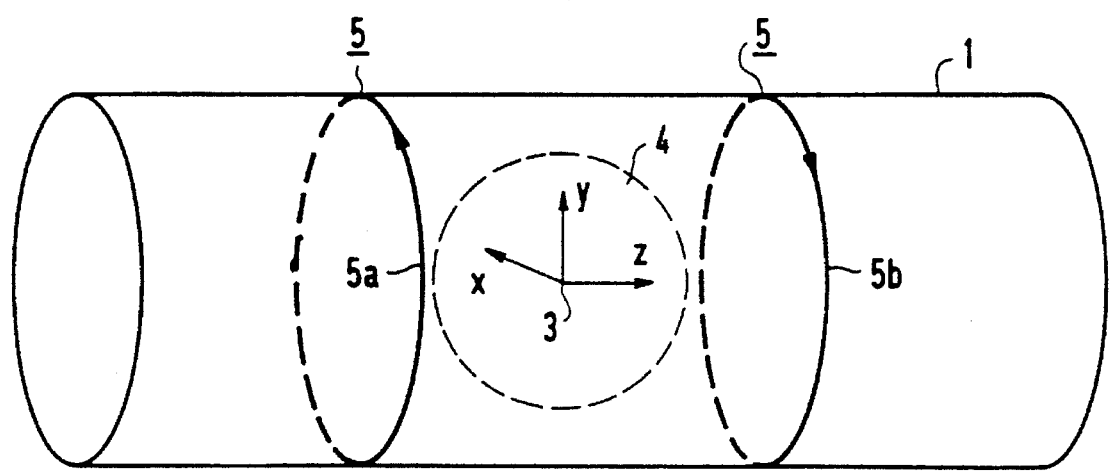
Figure 3:
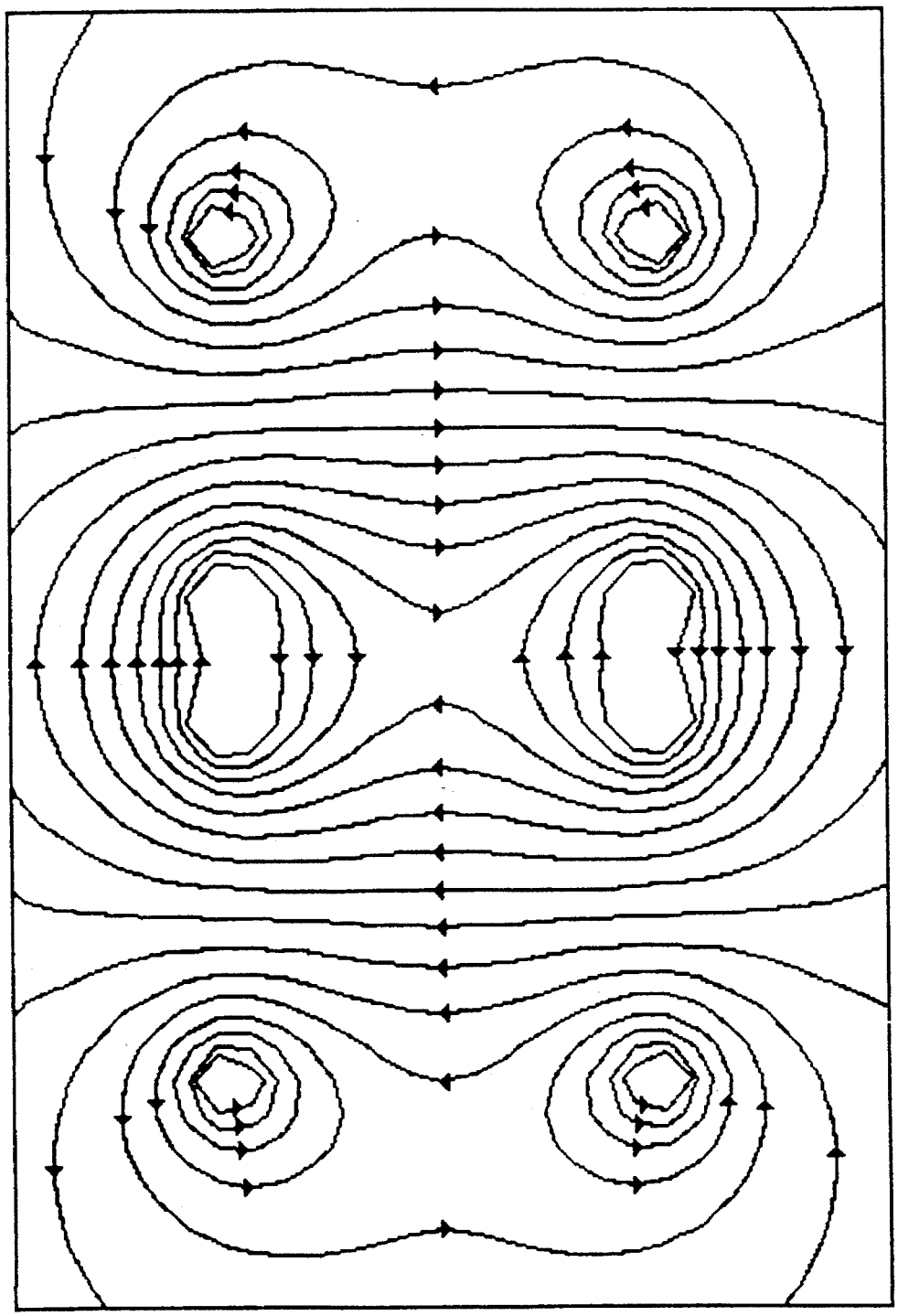
FIG. 3 illustrates the field lines of the y-gradient in the plane x =0 produced by the known coil arrangement of FIGS. 1 and 2.

For illustrating the invention, an actively shielded transverse gradient coil arrangement is schematically shown again in FIG. 4, in the longitudinal direction and in the transverse direction. As in all the following Figures as well, the respective four coil parts for each transverse gradient coil arrangement have not been shown; only the respective cylinder surfaces are shown. In conventional arrangements, a primary coil $2a$ and a secondary coil $2b$ respectively lie on cylinder surfaces that are concentric relative to one another, and thus have a constant spacing from one another.

The invention then proceeds on the basis of the idea that greater possibilities for optimization in the aforementioned sense (in particular, minimized flux density) are obtained when the standard structure of the double cylinder is abandoned in favor of a more flexible geometry, and thus parasitic flux components are minimized.

In actively shielded gradient coils, the spacing $\delta r$ between the primary and secondary coils defines the field effect of the overall arrangement. In the following, the sensitivity of the primary coil by itself is referenced g. What is meant by sensitivity is the magnetic field gradient generated per unit of current by the gradient coil arrangement. The sensitivity of the combination of primary and secondary coil is referenced $G = G (\delta r)$. If the diameter of the primary coil is referenced R, then:

$$G(\delta r)=g(1-[R/(R+\delta r)]^4)$$

When $\delta r$ is substantially smaller than R, the following approximation applies:

$$G(\delta r) \sim g \cdot 4\delta r/R.$$

One can derive from this relationship that the field effectiveness is greatly reduced with decreasing distance between a field-generating winding and its shielding. Approximately the following quantities apply given currently standard, actively shielded gradient coils in whole body tomographs: R~350 mm, $\delta r$ ~70 mm, G~0.5 g.

If, for example, the distance $\delta r$ were reduced to 10 mm, then G~ 0.1 g.

Qualitatively, these estimates are also valid for individual conductors and their associated shielding conductors. A rule is derived from this regularity as to how one inventively proceeds to more beneficial coil geometries. The basic idea is thereby to reduce the spacing of the return conductors and their neighboring shielding windings in the coil part facing away from the examination volume 4 to such an extent that the parasitic effect thereof is adequately minimized. "Return conductors" means the part of the windings disposed facing away from the examination space 4.

By reducing the spacing in the coil part, in addition to a lower coil inductance a noticeable reduction of the parasitic flux density is obtained. When the distance $\delta r$ is allowed to approach zero, then the return conductors of the primary and secondary coils geometrically coincide since they are oppositely traversed by the same current. Their contribution to the coil field likewise becomes zero. Given such coil arrangements, even a part of the primary and secondary return conductors is then entirely eliminated, so that the coils become shorter and, moreover, have lower dissipative losses.

Dependent on optimization priorities and given different magnet types, different embodiments can be advantageous. Examples of such embodiments are shown in FIGS. 5–13. In the embodiment of FIG. 5, the secondary coil 2a lies on a cylinder surface, the middle part B of the primary coil 1a lies on a cylinder surface having a smaller diameter, the edge regions A and C are conically shaped and converge with the secondary coil 2b at the ends. This form is especially suited for classic magnets having a cylindrical opening and a funnel-shaped patient opening.

In the embodiment of FIG. 6, the primary coil 2a lies on a cylinder surface, whereas the secondary coil 2b has a cylindrical middle part and conical outer parts. This embodiment is especially suitable for magnets that have larger passive correction elements 4 at the edge regions in the interior space.

Figure 7:
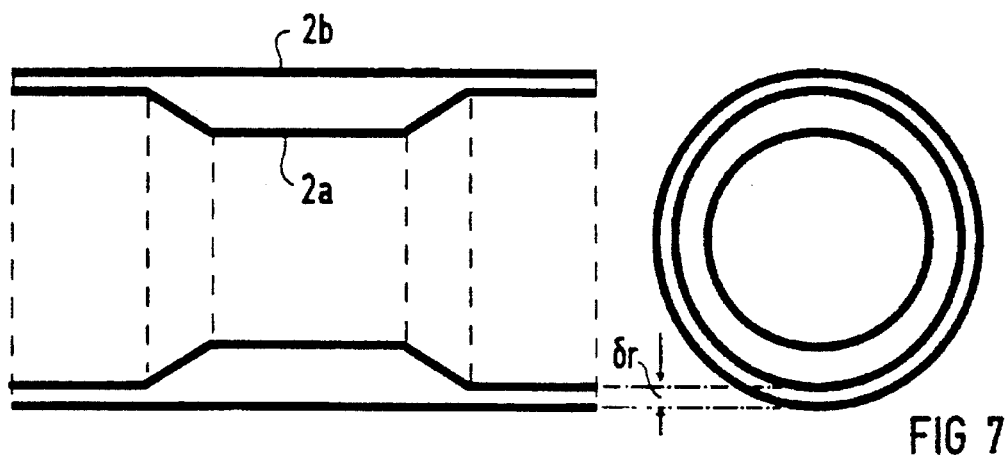
Figure 8:
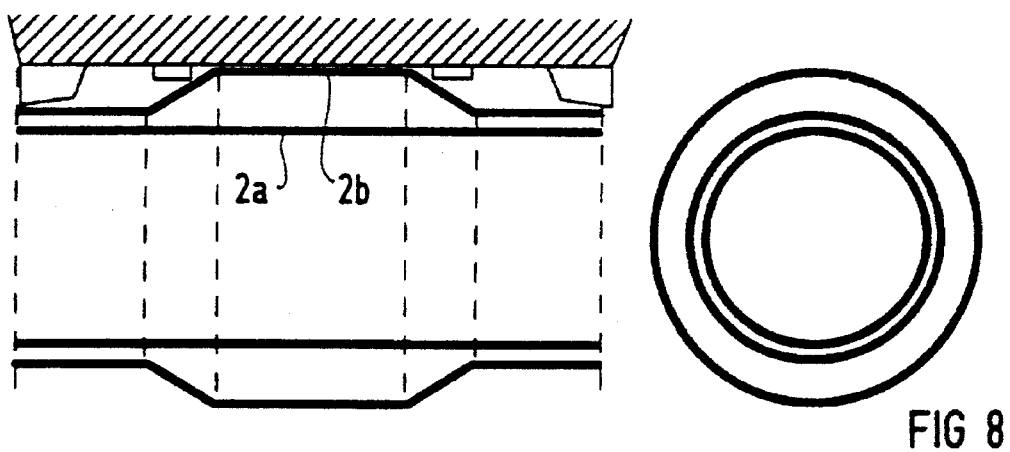

In the embodiments of FIGS. 7 and 8, one coil (primary coil 2a or secondary coil 2b) lies on a cylinder surface, whereas the other coil lies on a surface composed of a cylindrical middle part, two conical parts adjoining thereto and cylindrical outside parts. Such arrangements can have manufacturing-oriented advantages.

Figure 9:
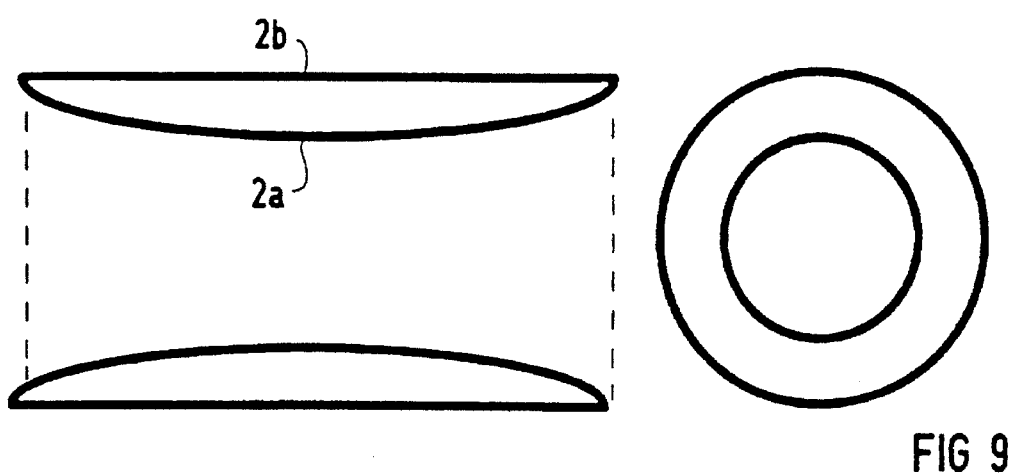

FIG. 9 shows a more complex structure wherein the primary coil 2a lies on an arcuate rotational solid.

Figure 10:
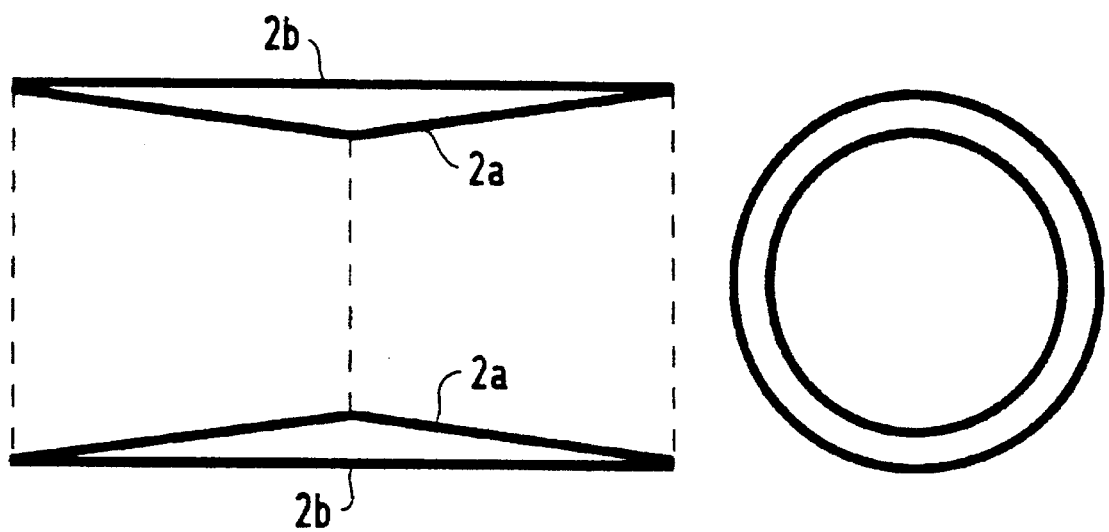
Figure 11:
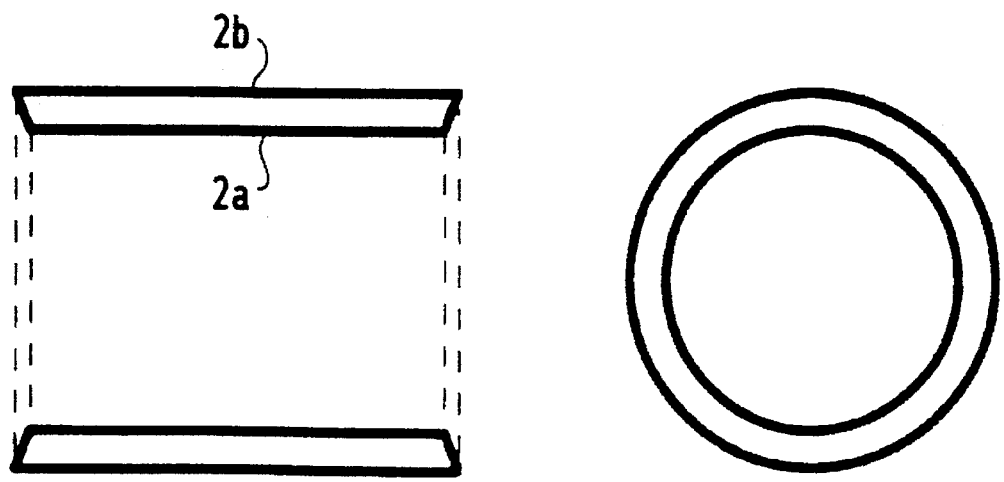

A few limit cases of the inventive gradient coil arrangement are shown in FIGS. 10–13. In the version of FIG. 10, the primary coil 2a is fashioned in the form of a double cone symmetrically relative to the center plane. In the version of FIG. 11, the primary coil 2a has a relatively long cylindrical middle part and short, conical outer parts. In this schematic illustration, the gradient coil arrangement looks similar to a conventional, actively shielded gradient coil arrangement, however, it must be pointed out that, differing from the known structure, the conductors change from one cylindrical surface to the other. Whereas one conductor always remains on a generated cylinder surface in the conventional arrangement, many conductors (windings) in the inventive gradient coil arrangements change from one to the other plane in a complex pattern. The change from one plane to another ensues via the all-around annular segments of the conical part of the primary or secondary coil.

Figure 12:
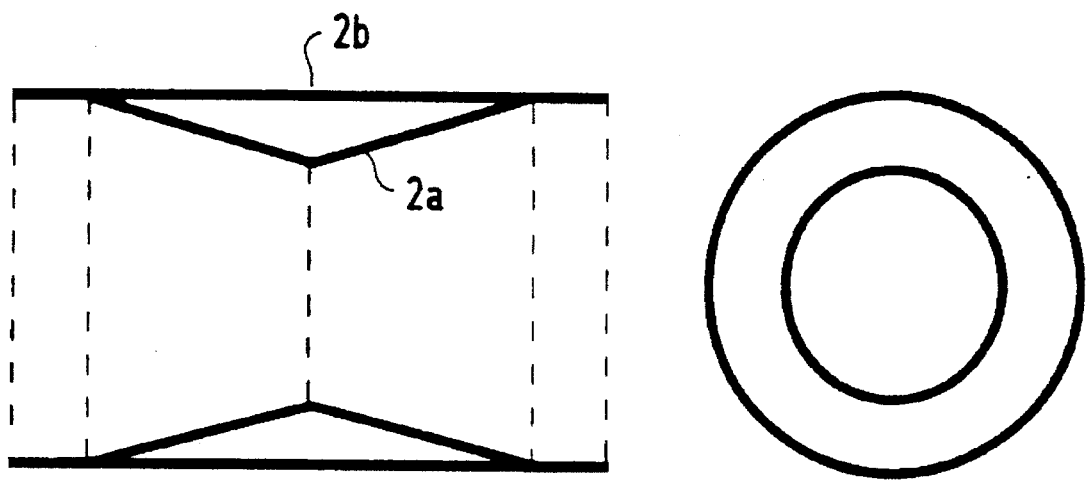
Figure 13:
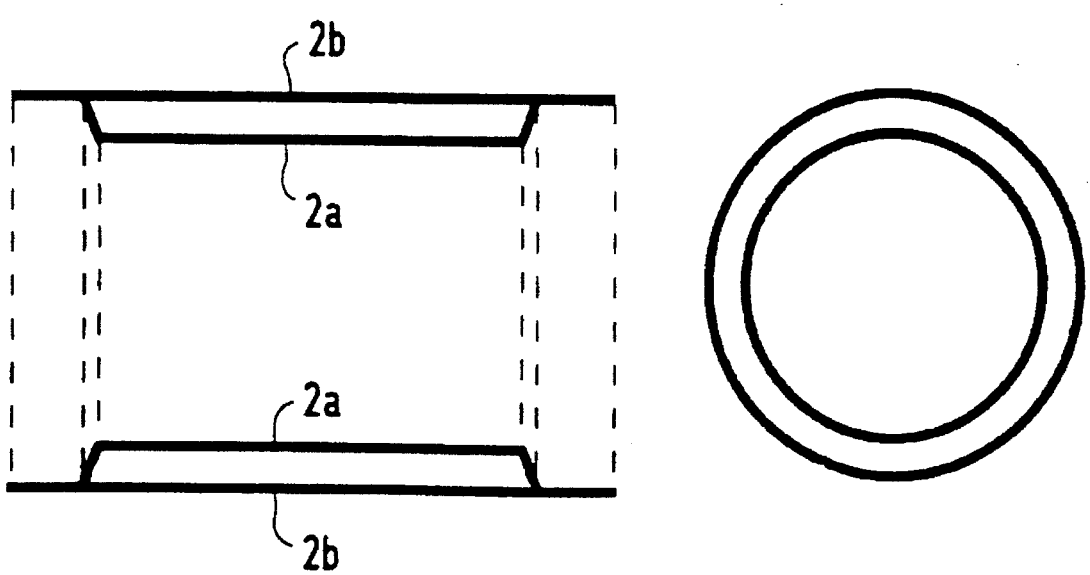
Figure 17:
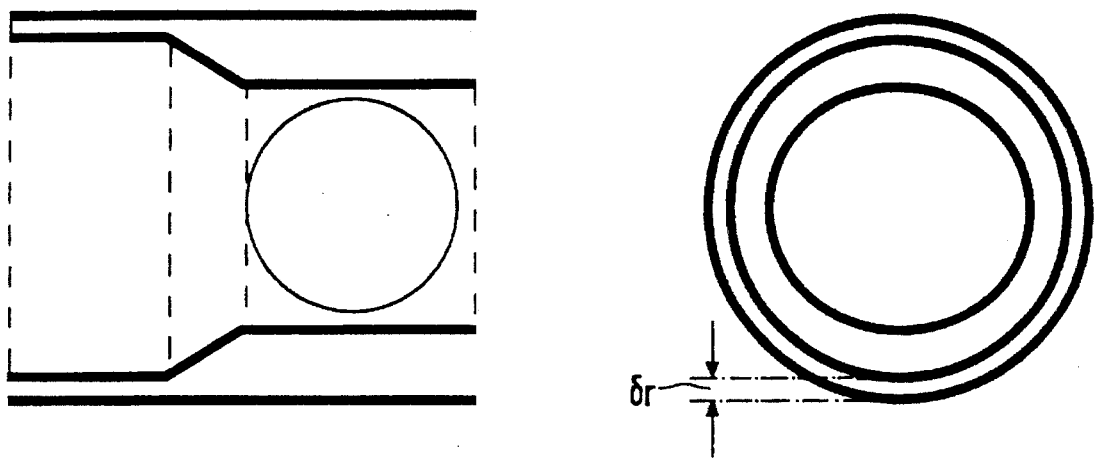
Figure 18:
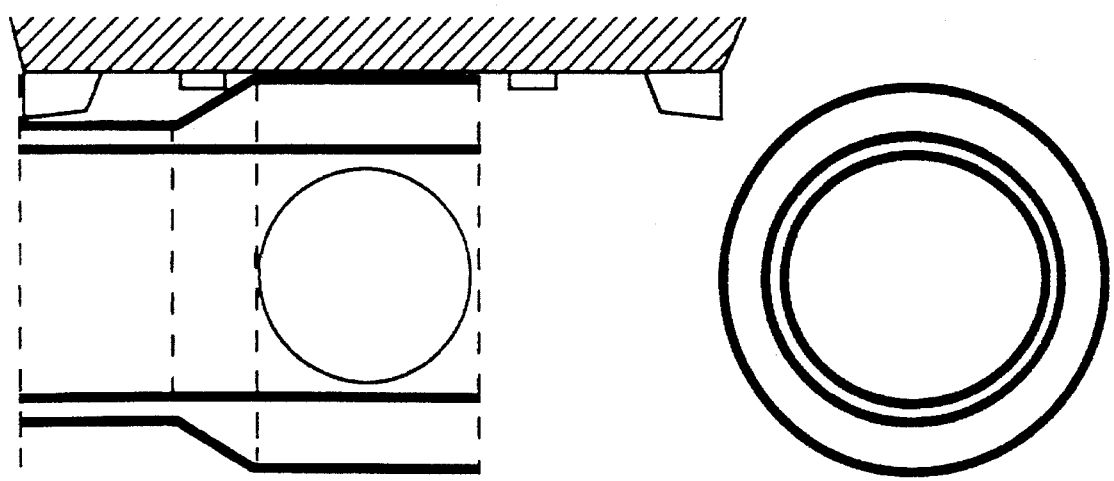

The exemplary embodiments of FIGS. 12 and 13 essentially respectively correspond to those of FIGS. 10 and 11, however, the secondary coil 2b is longer than the primary coil 2a. This has proven useful for a good shielding effect.

It is known to asymmetrically construct gradient coils, for example from the paper by "Myers, et al., "Highly Linear Asymmetric Transverse Gradient Coil Design for Head Imaging", Abstracts of 10th Annual Meeting SMRM 1991, p. 711. Such asymmetrical gradient coils are available for special registration procedures, for example at the head. The advantages, among others, of such a coil are the short structural length and the lower inductance compared to symmetrically constructed coils. A conventional actively shielded asymmetrical gradient coil is shown in FIG. 14.

The aforementioned advantages of an asymmetrical gradient coil can be improved even more using the principles of the present invention by selecting a non-constant spacing between primary and secondary coil. Corresponding exemplary embodiments are shown in FIGS. 15–18. The exemplary embodiment of FIG. 15 thereby essentially corresponds to that of FIG. 5. The exemplary embodiment of FIG. 16 corresponds to that of FIG. 6 and is thus likewise especially suitable for magnets having larger built-in units. The embodiments of FIGS. 17 and 18 correspond to those of FIGS. 7 and 8.

For designing the winding design, one can proceed on the basis of a method as disclosed in the aforementioned German OS 42 03 582 and U.S. Pat. No. 5,309,107, the teachings of the latter being incorporated herein by reference. Since a departure from the cylindrical surface is made here, however, a generalization of method disclosed therein is necessary. The calculation of the winding design, for example, ensues by the following steps.

Figure 19:
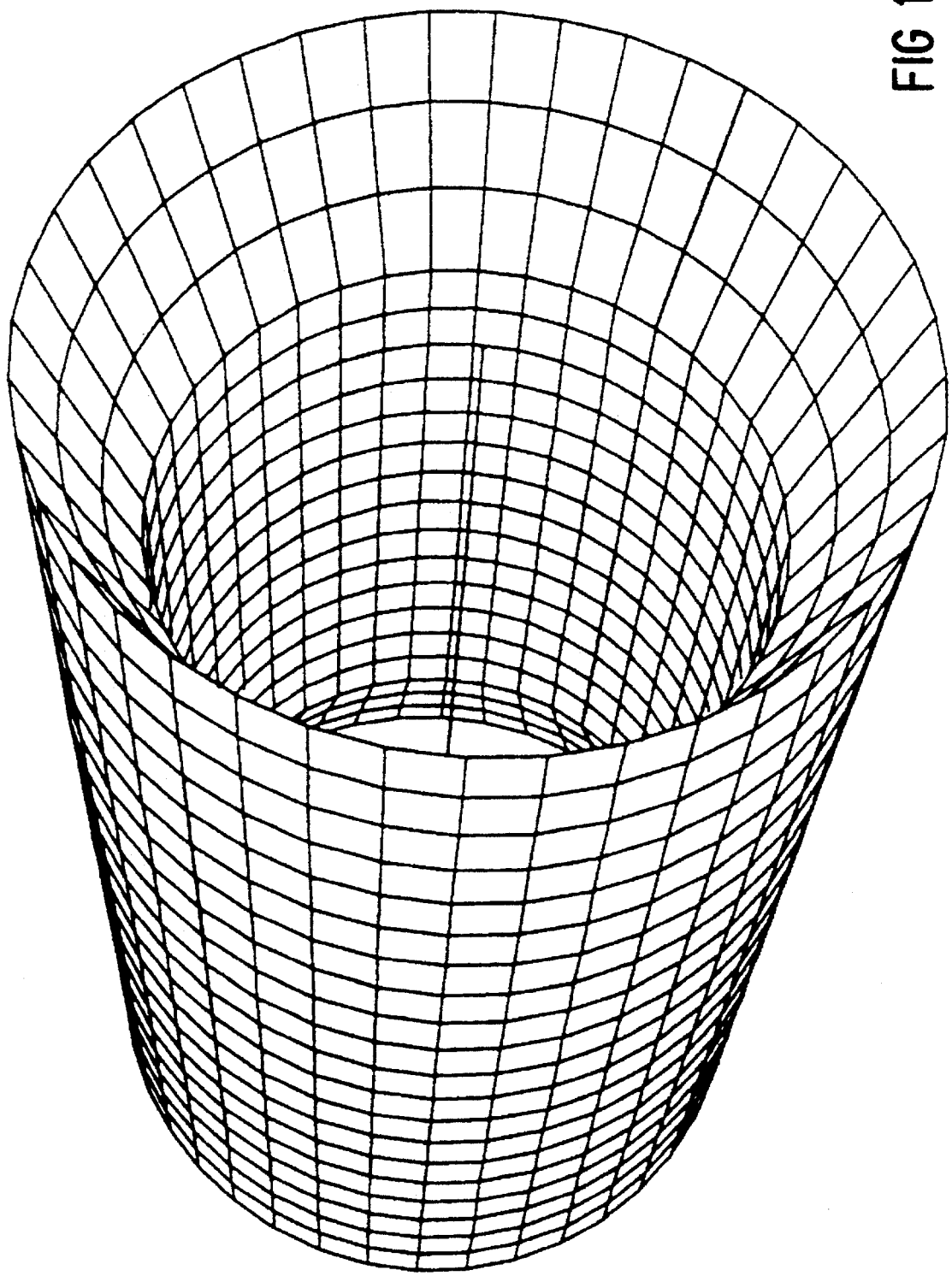
FIG. 19 a mesh network for calculating the conductor course of a gradient coil of the invention.
Figure 20:
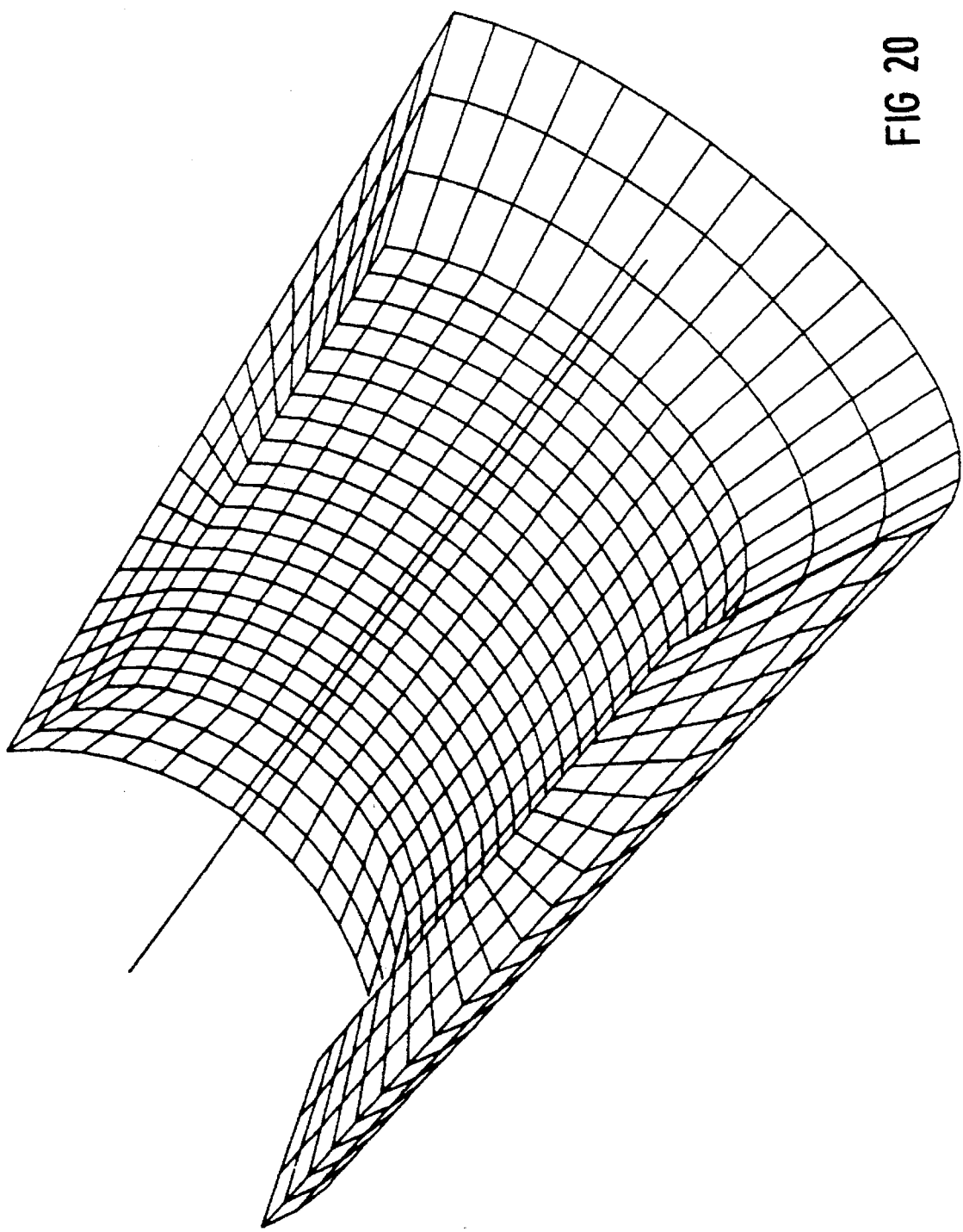
FIG. 20 illustrates a corresponding mesh network for a single coil segment.
Figure 21:
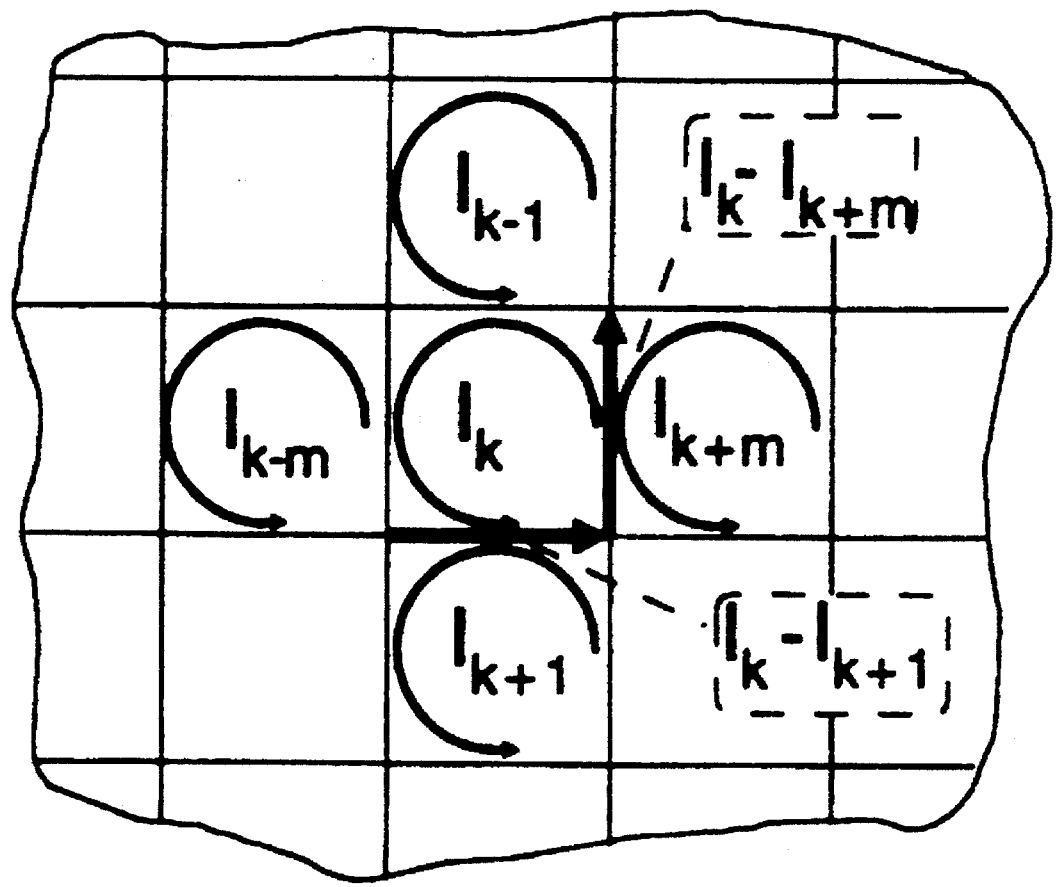
FIG. 21 illustrates a current distribution in the meshes;.

First Step:

After a determination has been made regarding the basic arrangement, for example according to one of the exemplary embodiments set forth above, the imaginary surface on which the gradient coil arrangement is to lie is covered with a mesh network. This is illustrated in FIG. 19 for an arrangement according to FIG. 5. The mesh network defined in this way, however, is not composed of rectangular, identically shaped meshes as described in U.S. Pat. No. 5,309,107. In the conical part of the gradient coil arrangement, for example, approximately trapezoidal meshes are employed. Other meshes can assume the shape of annular segments, etc. For symmetry reasons, a transverse gradient coil given symmetrically constructed gradient coils is composed of respective 2×4 identically wound sub-coils; given asymmetrically constructed gradient coils is composed of 2×2 identically wound sub-coils. It is therefore advantageous when the coils are calculated quadrant-by-quadrant and the possibility that the winding curve can change between primary coil and secondary coil over the azimuthal edge is thereby added as additional degree of freedom. Given a quadrant-by-quadrant calculation, a mesh network as shown in FIG. 20 is obtained.

The n meshes of the mesh network are consecutively numbered in the sense of mathematical ordering.

Second Step:

A plurality of n points $P_i$ is selected in the volume of interest, whereby (i = 1 . . . n), n > m apply. Let the desired target field $Z_i$ be defined in these points $P_i$.

Third Step:

Let a unit current flow successively in each of the m meshes. The field $b_{ij}$ generated by this unit current in each of the n points is calculated for each mesh. The field $b_{ij}$ is thus the field contribution of a unit current in the $j^{th}$ mesh at the location of the $i^{th}$ point. The following definitions form the basis: b= $(b_{ij})$ is the total matrix of all mesh elements. $I^t$= $(I_1, I_2, \ldots I_m)$ is a vector with mesh currents, i.e. $I_k$ is the current that flows in the $k^{th}$ mesh. Further, $B^t$=$(B_1, B_2, \ldots B_n)$ with $B_k$=$\Sigma b_{kj} \cdot I_j$ is the vector of all field contributions in the n points. Then valid is:

$$B = b \cdot I$$

Fourth Step:

A solution vector I is defined such with a suitable fit algorithm (for example, "least mean squares") that the sum of the quadratic deviations from the target field becomes minimum. This occurs, for example, by left multiplication of the above relationship by the term $(b^t \cdot b)^{-1} \cdot b^t$. Thus obtained is:

$$I = (b^t \cdot B)^{-1} \cdot B^t \cdot B$$

Fifth Step:

Since each mesh branch except for the edge meshes belongs to two neighboring meshes, the resultant current for each such branch must be defined by superimposing the two mesh currents, as shown in FIG. 9. A current of $I_k - I_{k+m}$ thus derives, for example, for the mesh branch lying between the meshes k and k + m. A mesh current of $I_k - I_{k+1}$ derives for the mesh branch lying between the meshes k and k +1.

One thus obtains a global current distribution on the generated surface that generates the desired target field and satisfies the continuity equation. The latter is valid since each mesh is self-contained. Adherence to this condition is important since only in this way is a simulation of the three-dimensional current distribution by a closed circuit position.

Sixth Step:

The given current distribution is simulated with discrete conductors in which a constant predetermined current flows. Various solutions are known for this. For example, a defined area can first be assigned to every mesh branch (mesh width x mesh length) wherein the calculated current should flow. A distribution of current density is subsequently calculated from the global current distribution in the surface and, after a further division by the predetermined current, a winding density distribution is calculated in the given generated surface. The spatial curve of the respective conductors can be defined therefrom by integration along suitable integration paths (for example, projection of a bundle of straight lines through the stagnation point of the winding density distribution onto the generated surface). To this end, the winding density function is integrated along the path until the value of the integral becomes a whole number. The position of the conductor is defined such within the integral boundaries defined in this way that portions of the winding that are of equal size come to lie at both sides.

U.S. Pat. No. 5,309,107 is referenced again with respect to further details regarding the method of defining a winding design on the basis of a mesh network.

Given the method presented here, the emphasis of the optimization goal at hand is the minimization of the dissipated losses. This auxiliary demand runs contrary to a certain extent to the required field course in the useful volume. This can be demonstrated by considering that the minimization of the dissipative losses could be satisfied in the simplest case by no current flowing at all, but of course, no useful field would be present.

Such competing objectives are generally placed in relationship to one another by means of weighting factors in an optimization task. The function to be minimized could then, for example, by defined as follows:

Each side of a mesh (referred to as a branch) can have a relative resistance $R_i (i=1, \ldots, v)$ allocated to it which is proportional to the length $L_i$ of the branch and inversely proportional to the width $B_i$ thereof:

$$R_i = L_i / B_i$$

The dissipative contribution of this mesh branch to the overall thermal load is therefore proportional to $R_i J_i^2$, whereby $J_i = (I_k - I_m)$ is the current that flows through the $i^{th}$ branch that is shared by the $k^{th}$ and $m^{th}$ mesh.

If the above-described weighting factor is referenced w, the optimization goal is:

$$\text{minimize } Q = \sum_{i=1}^{v} \left[ \left( \sum_{j=1}^{m} b_{ij} \cdot I_j \right) - Z_i \right]^2 + w \cdot \sum_{i=1}^{v} R_i J_i^2$$

The boundary condition of optimally low dissipative losses can, moreover, also be combined with other physical requirements such as, for example, minimization of the coil energy. All self-inductances and coupling inductances of the mesh network are calculated for this purpose. When the coupling inductance of the $k^{th}$ mesh with the $l^{th}$ mesh is referenced $L_{kl}$ and the self-inductance of the $k^{th}$ mesh is referenced $L_{kk}$, then the coil energy W is obtained from:

$$W = \frac{1}{2} \cdot \sum_k L_{kk} \cdot I_k^2 + \sum_{k<l} L_{kl} \cdot I_k \cdot I_l$$

Finally, the function $Q_w$ to be minimized is correspondingly expanded:

$$Q_w = Q + \omega \cdot W$$

wherein $\omega$ is a further weighting factor that places the minimization of the coil energy in relationship to the aforementioned demands.

Figure 22:
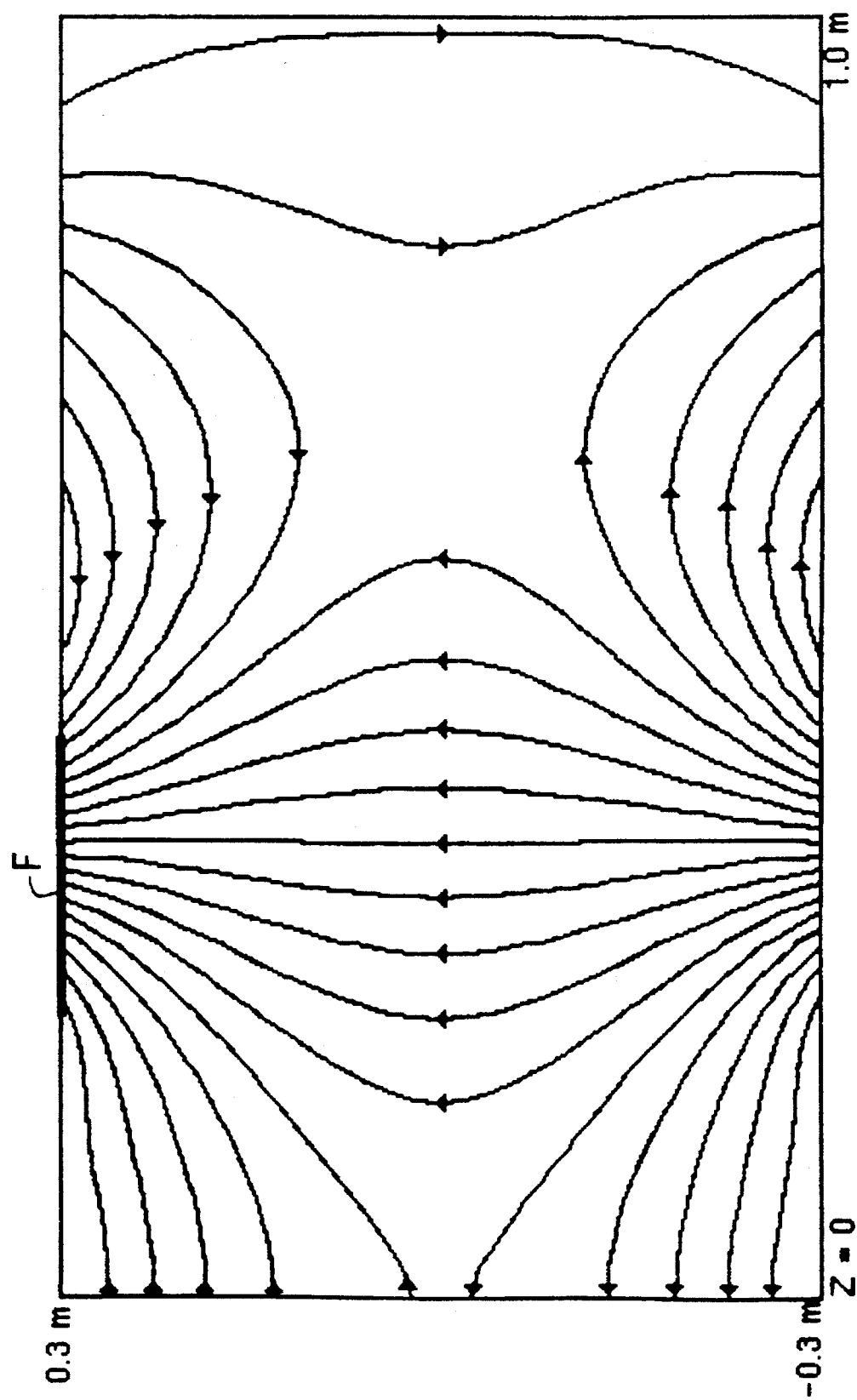
FIGS. 22 and 23 show a comparison of the field line courses for a conventionally constructed gradient coil and an inventive gradient coil within a comparison area.
Figure 23:
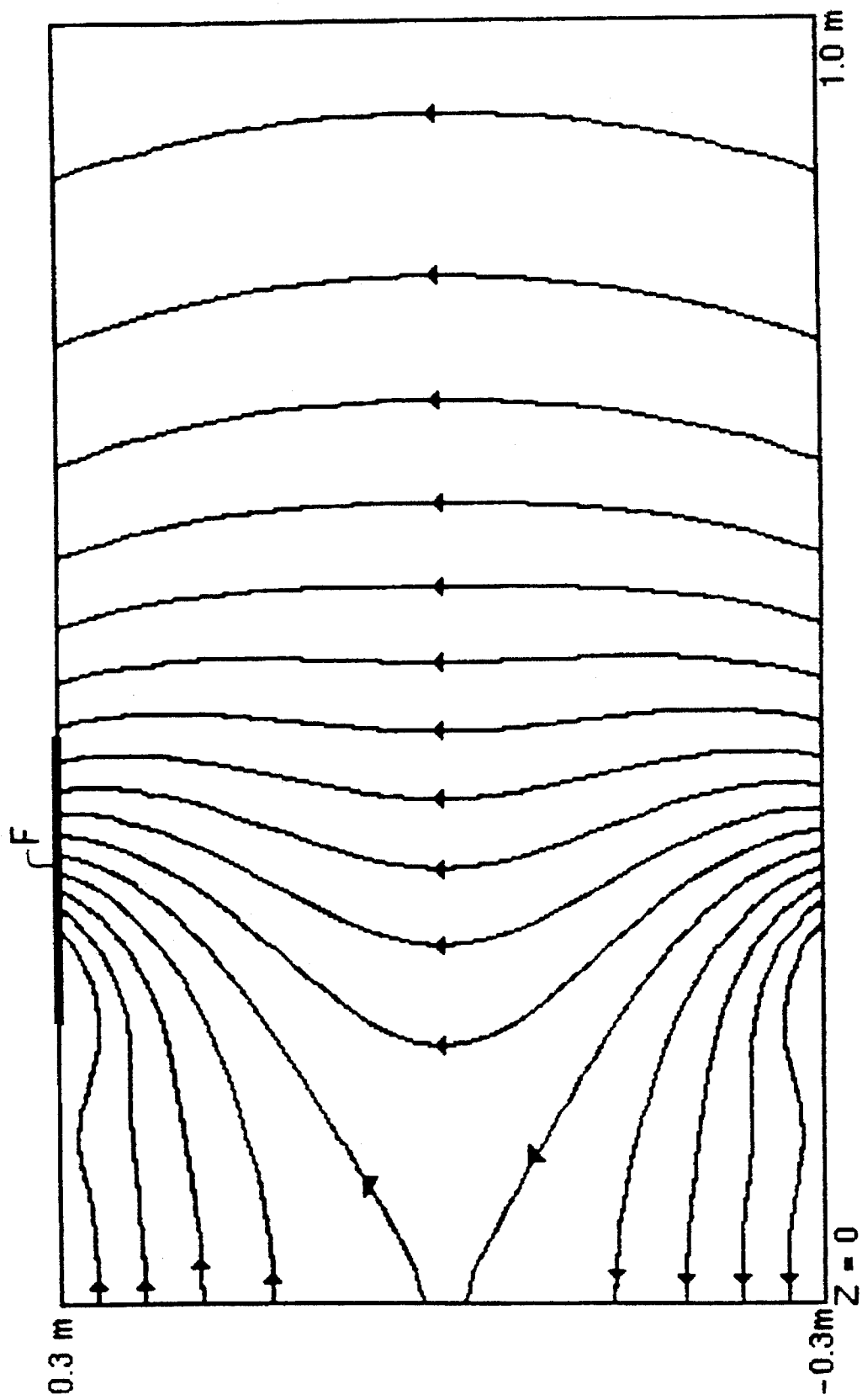

As an example, FIG. 22 shows the field line course of a conventional, actively shielded gradient coil of FIG. 4, whereas the field line course of a gradient coil of FIG. 5 optimized according to the described method is shown in FIG. 23. More precisely, the isocontour lines of the vector potential are respectively shown. Further, a comparison surface F is defined. The coil sensitivity of both coils amounts to 0.1 (mT/m)/A. Likewise, the maximum non-linearities on a spherical volume having a diameter of, for example, 45 cm are of approximately the same size, approximately 5%, for both versions.

Figure 24:
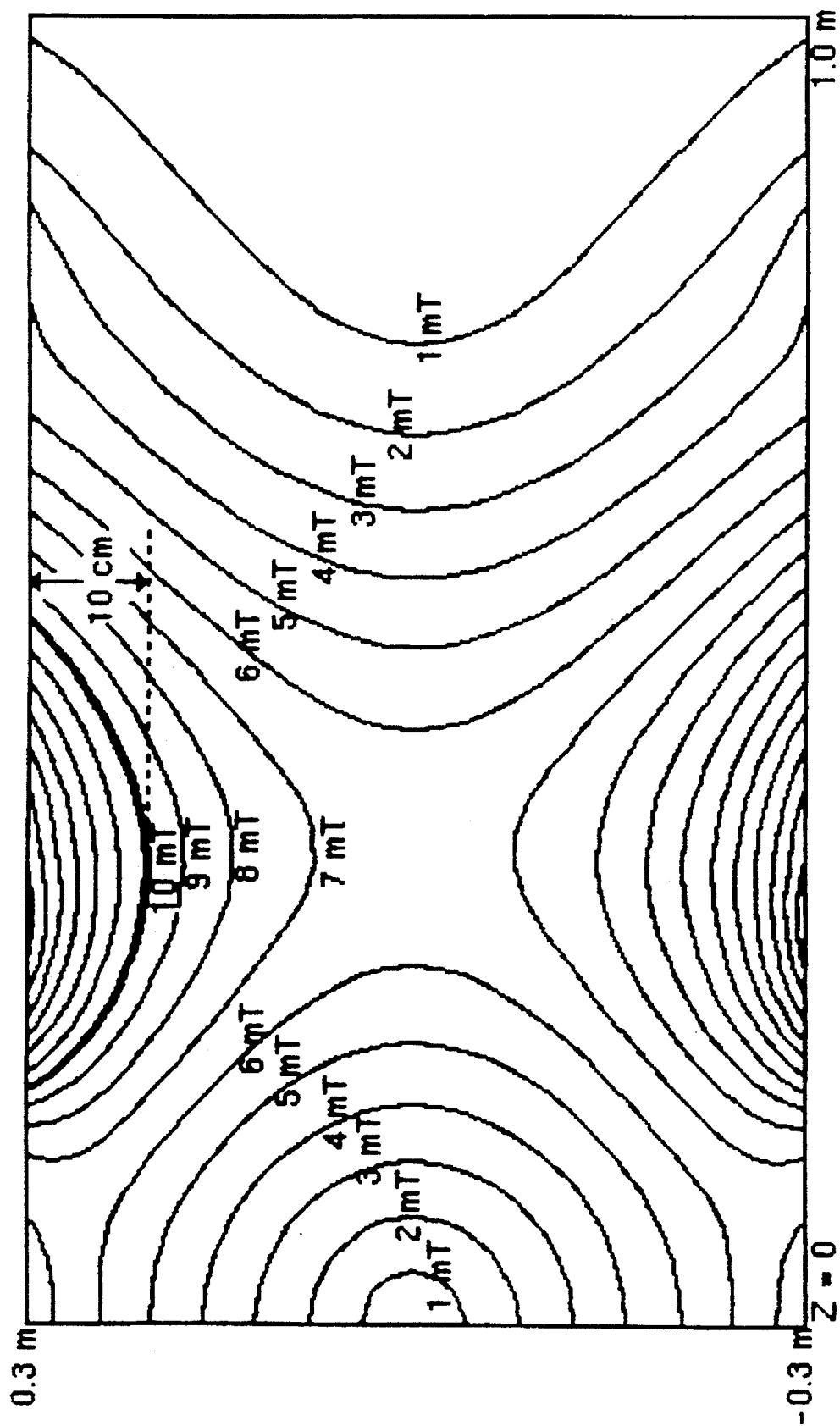
FIGS. 24 and 25 show a comparison of the isocontour line plots of the IB I field in the y-z plane for a conventional gradient coil and an inventive gradient coil.
Figure 25:
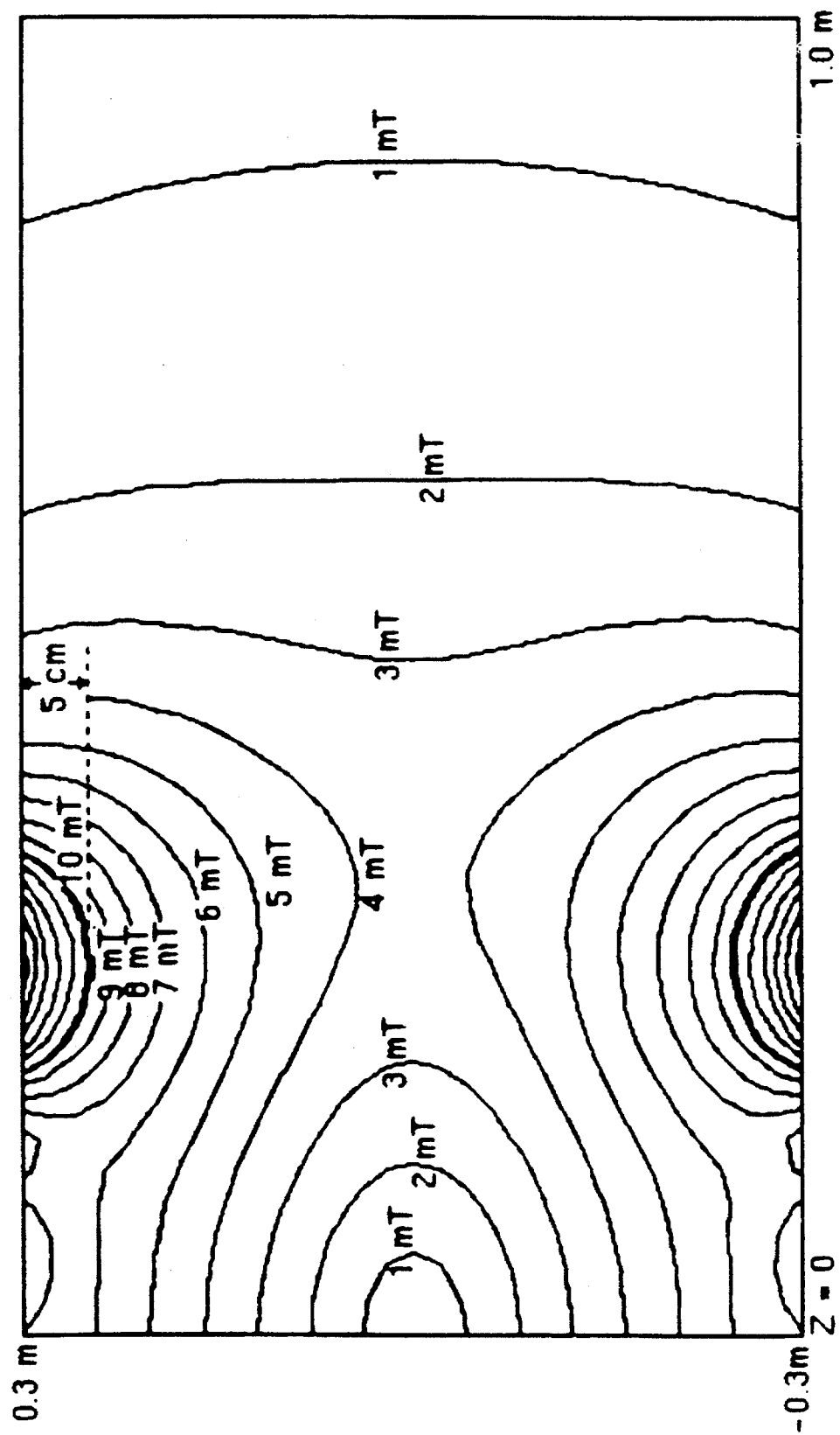

One can clearly see that the overall flux (recognizable on the basis of the number of field lines through the identically defined comparison surfaces F) is substantially higher in the conventional arrangement of FIG. 22 than in the optimized arrangement of FIG. 23 constructed as described herein. Given the same useful field, thus, the gradient coil as optimized herein will cause clearly lower unwanted stimulation in a subject than conventional gradient coils, or will lead to stimulations only in the case of significantly larger rise steepnesses of the field. FIGS. 24 and 25 show a comparison of the B-field for quantifying the qualitative statement according to FIGS. 22 and 23. An isocontour plot has again been selected for the illustration (for conventional gradient coils in FIG. 24 and for an inventively optimized gradient coil in FIG. 25). When, for example, the 10 mT line that has been specifically emphasized is considered, one can see that:

this line extends substantially more deeply into the patient volume in the conventional arrangement of FIG. 24 than in the arrangement of FIG. 25; and that the sub-volume, at B> 10 mT, is more than twice as long in the z-direction in the case of FIG. 24 than in the case of the gradient coil of FIG. 25.

Figure 26:
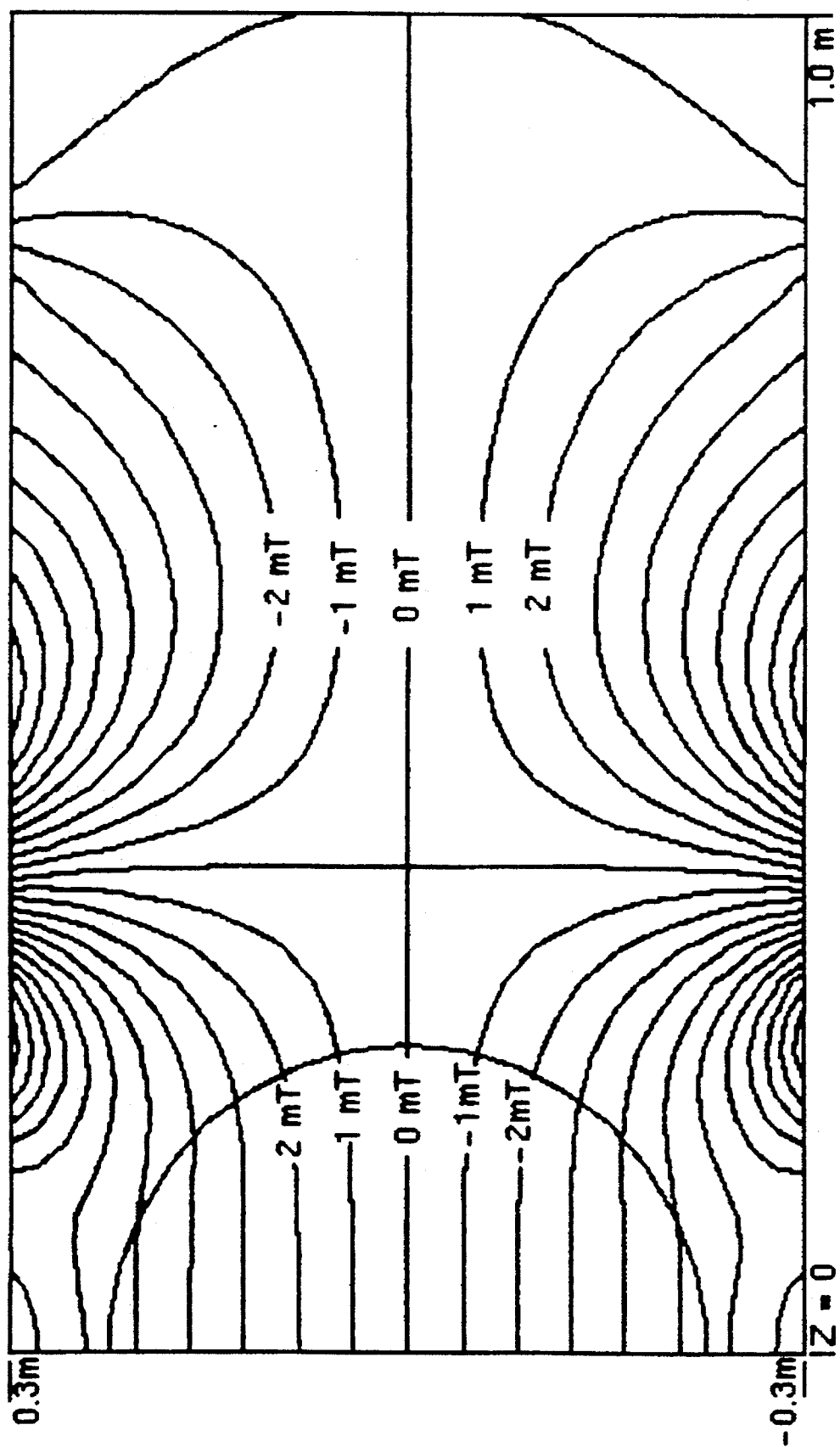
FIGS. 26 and 27 show a comparison of the isocontour line plots of the $B_z$ component in the y-z plane for a conventional gradient coil and an inventive gradient coil.
Figure 27:
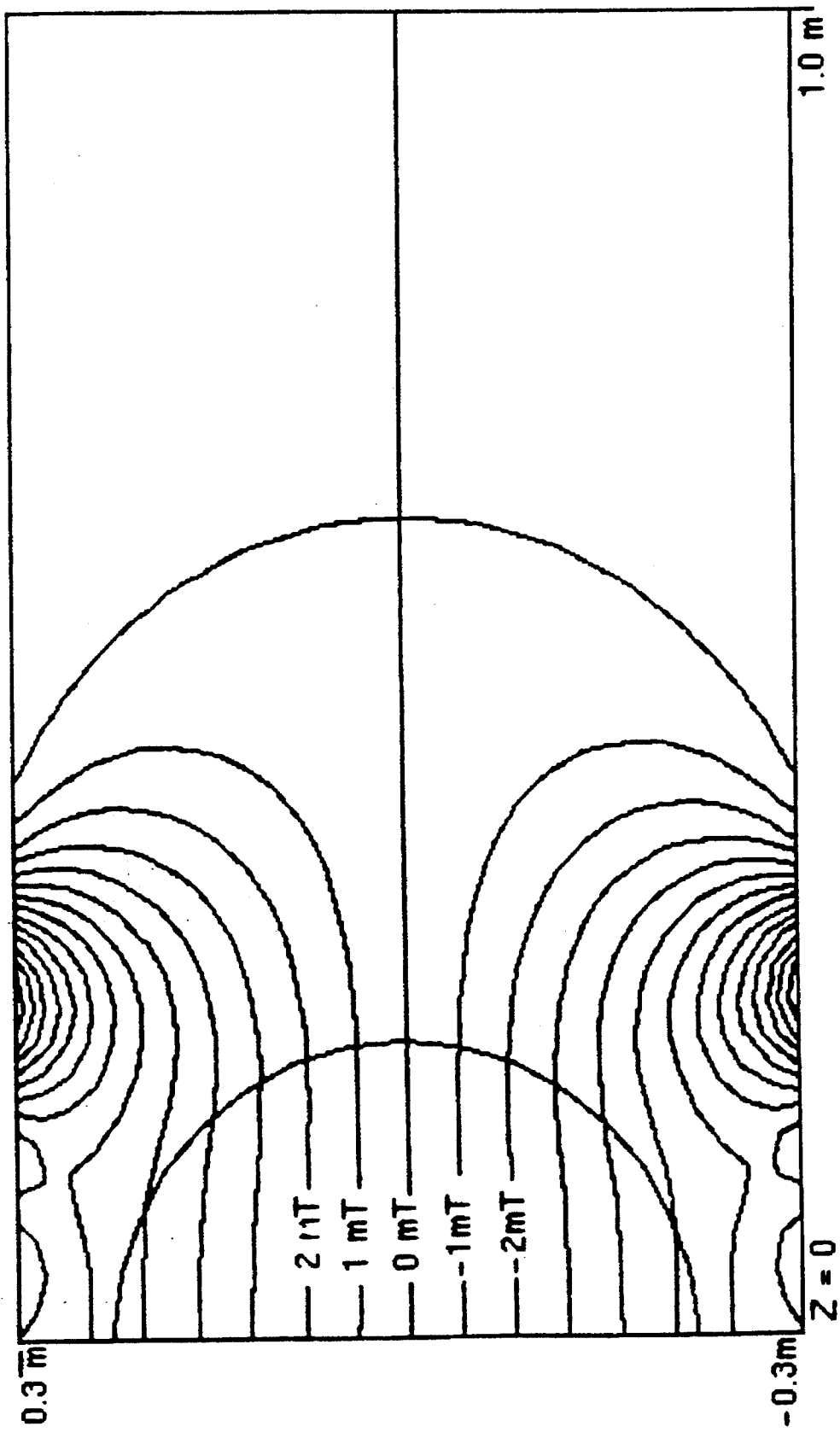

FIGS. 26 (conventional arrangement) and 27 (optimized arrangement), finally, show a comparison of the useful fields relevant to the magnetic resonance examination, i.e. the $B_z$ component of the gradient field. The linearity of the gradient field occurs at the z-parallel, equidistant contour lines in the illustrated imaging volume. One can clearly see that the linearity volumes are comparable in the radial direction but the linearity volume produced by the inventively optimized coil in the z-direction extends even somewhat longer in the z-direction than given the conventional arrangement of FIG. 26, i.e., the volume that can in fact be used has become greater and has an ellipsoid shape elongated (in this case) in the z-direction here.

In summary, the gradient coil described herein has the following advantages compared to a conventional structure, given identical sensitivity:

the ratio of useful field to overall coil field is substantially more beneficial and allows significantly higher frequencies before a physiological stimulation occurs. This is important particularly in what are referred to as EPI sequences.

the inductance of the gradient coil becomes lower.

the linearity volume is extended longer in the z-direction.

the structural length of the gradient coil is shorter and can be reduced, for example, to half the original length.

the dissipative losses are lower; for example, a reduction by 35% arises with respect to the dc resistance.

The sole disadvantage of the gradient coil arrangement of the invention is higher manufacturing and assembly outlay necessitated by dimensionally precisely positioning the three-dimensional conductor arrangement.

Although modifications and changes may be suggested by those skilled in the art, it is the intention of the inventors to embody within the patent warranted hereon all changes and modifications as reasonably and properly come within the scope of their contribution to the art.

WE CLAIM AS OUR INVENTION:

1. In a magnetic resonance imaging apparatus for producing a tomogram of an examination subject disposed in an examination volume of the apparatus, the improvement of an actively shielded transverse gradient coil arrangement comprising:

a plurality of gradient coils;

each gradient coil being composed of a primary coil and a secondary coil disposed at a radial spacing from each other with the secondary coil lying on a larger radius than the primary coil;

means for supplying said primary coil and said secondary coil with current for causing said primary and secondary coil, in combination, to generate a linear magnetic field in a center of said examination volume; and each of said primary coil and said secondary coil having windings which are farther from said center in an axial direction of the gradient coil and windings which are closer to said center, said windings of said primary coil and said secondary coil which are farther from said center having a smaller radial spacing from each other than said windings disposed closer to said center.

2. The improvement of claim 1 further comprising a carrier for said primary coil, said carrier having a cylindrical portion in a region facing said center of said examination volume, and conical end regions adjoining said cylindrical region, said conical end regions each having an outwardly increasing diameter.

3. The improvement of claim 2 wherein said cylindrical portion of said carrier is shorter in said axial direction than said conical end portions.

4. The improvement of claim 2 wherein each of said conical end portions of said carrier are shorter in said axial direction than said cylindrical portion.

5. The improvement of claim 1 further comprising a carrier for said secondary coil, said carrier having a cylindrical portion in a region facing said center of said examination volume, and conical end regions adjoining said cylindrical region, said conical end regions each having an outwardly decreasing diameter.

6. The improvement of claim 5 wherein said cylindrical portion of said carrier is shorter in said axial direction than said conical end portions.

7. The improvement of claim 5 wherein each of said conical end portions of said carrier are shorter in said axial direction than said cylindrical portion.

8. The improvement of claim 1 further comprising:

a first carrier for said primary coil, said first carrier having a cylindrical portion facing said center of said examination volume and conical outer portions adjoining said cylindrical portion on opposite sides, each conical portion of said first carrier having an outwardly increasing diameter; and a second carrier for said secondary coil, said second carrier having a cylindrical portion facing said center of said examination volume and conical outward portions adjoining said cylindrical portion on opposite sides, each conical portion of said second carrier having an outwardly decreasing diameter.

9. The improvement of claim 8 wherein said cylindrical portion of each of said first and second carriers is shorter in said axial direction than the respective outer portions of each of said first and second carriers.

10. The improvement of claim 8 wherein the respective outer portions of each of said first and second carriers are shorter in said axial direction than the respective cylindrical portion of each of said first and second coil carriers.

11. The improvement of claim 1 wherein said primary coil and said secondary coil have a radial spacing of zero in a region farthest from said center of said examination volume, said primary coil and said secondary coil having windings which coincide in said region farthest from said center.

12. The improvement of claim 1 wherein said secondary coil is longer than said primary coil.

13. The improvement of claim 1 wherein said primary coil and said secondary coil are disposed on respective surfaces with an azimuthal edge therebetween, and said primary coil and said gradient coil being connected by windings which change over said azimuthal edge.

14. The improvement of claim 1 wherein said primary coil and said secondary coil of each gradient coil are asymmetrically constructed relative to said center of said examination volume, said examination volume being displaced to one end of said gradient coil.

15. A method for constructing a transversal gradient coil formed by a conductor for producing a target field distribution with a prescribed current in a magnetic resonance imaging system, said method comprising the steps of:

composing a gradient coil of a conductor having a plurality of windings forming a primary coil and a secondary coil disposed on respective winding surfaces with an azimuthal edge therebetween;

giving said secondary coil a larger radius than said primary coil;

disposing windings of said primary coil and said secondary coil which are farther from a center of an examination volume in an axial direction of the gradient coil at a smaller radial spacing from each other than windings of said primary coil and said secondary coil disposed closer to said center;

subdividing said surfaces on which said windings of said primary coil and said secondary coil are disposed into a grid mesh network having grid openings and mesh branches;

occupying each grid opening in said network with a modeled elementary coil in the form of a closed turn, each elementary coil generating a respective magnetic field;

calculating the magnetic field generated by each of said elementary coils;

defining a number of ampere-turns for each elementary coil using a fit algorithm based on said target field distribution;

calculating a number of ampere-turns for each mesh branch by superimposing the ampere-turns for all of the elementary coils adjacent each mesh branch and thereby obtaining an ampere-turn density distribution over said network;

successively integrating said ampere-turn density distribution over whole-numbers of turns along an integration path based on said prescribed current to obtain a plurality of points on said surfaces; and positioning said conductor on a carrier conforming to said surfaces in a configuration conforming to said points.

16. A method as claimed in claim 15 comprising the additional step of minimizing a maximum flux density in said examination volume.

17. A method as claimed in claim 15 comprising the additional step of minimizing inductive energy of said gradient coil.

* * * * *